US011215934B2

(12) United States Patent
Antonio et al.

(10) Patent No.: US 11,215,934 B2
(45) Date of Patent: Jan. 4, 2022

(54) IN-SITU LIGHT DETECTION METHODS AND APPARATUS FOR ULTRAVIOLET SEMICONDUCTOR SUBSTRATE PROCESSING

(71) Applicant: APPLIED MATERIALS, INC., Santa Clara, CA (US)

(72) Inventors: Ralph Peter Antonio, Los Gatos, CA (US); Shuran Sheng, Saratoga, CA (US); Lin Zhang, Santa Clara, CA (US); Joseph C. Werner, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/934,597

(22) Filed: Jul. 21, 2020

(65) Prior Publication Data

US 2021/0223707 A1    Jul. 22, 2021

Related U.S. Application Data

(60) Provisional application No. 62/963,593, filed on Jan. 21, 2020.

(51) Int. Cl.
*G03F 7/00* (2006.01)
*H01L 21/67* (2006.01)
*G03F 7/20* (2006.01)

(52) U.S. Cl.
CPC ...... *G03F 7/70841* (2013.01); *G03F 7/70033* (2013.01); *G03F 7/70175* (2013.01); *G03F 7/70958* (2013.01)

(58) Field of Classification Search
CPC ............ G03F 7/70841; G03F 7/70958; G03F 7/70175; G03F 7/70033; G05D 23/27; G05D 23/1919; H01L 21/67115; H01L 21/67248; H01L 21/0262; H01L 51/0048; C23C 16/509; C23C 16/26; C23C 16/52; C23C 16/481; C23C 16/0272; C23C 16/482; C23C 16/4586; C23C 16/455;
(Continued)

(56) References Cited

U.S. PATENT DOCUMENTS 6,563,092 B1    5/2003    Shrinivasan et al.
7,638,780 B2    12/2009    Kilburn et al.
(Continued)

OTHER PUBLICATIONS

International Search Report for PCT/US2020/058646, dated Feb. 25, 2021.

*Primary Examiner* — Mesfin T Asfaw
(74) *Attorney, Agent, or Firm* — Moser Taboada

(57) ABSTRACT

Methods and apparatus for detecting ultraviolet light are provided herein. For example, an ultraviolet (UV) process chamber includes a vacuum window or a transparent showerhead; a UV light source disposed above one of the vacuum window or the transparent showerhead and configured to generate and transmit UV light into a process volume of the UV process chamber; and a first UV sensor configured to measure at least one of emissivity from the UV light source or irradiance of the UV light transmitted into the process volume and to transmit a signal corresponding to a measured at least one of emissivity from the UV light source or irradiance of the UV light to a controller coupled to the UV process chamber during operation.

20 Claims, 5 Drawing Sheets

(58) Field of Classification Search
CPC ... C23C 16/4585; C23C 16/466; C23C 16/46; C23C 14/541; H01J 37/32091; H01J 37/32541; H01J 37/32
See application file for complete search history.

(56) References Cited

U.S. PATENT DOCUMENTS

| | | | |
|---|---|---|---|
| 7,935,940 | B1 | 5/2011 | Smargiassi |
| 8,426,778 | B1* | 4/2013 | Bolt ..................... B05D 3/067 |
| | | | 219/405 |
| 2005/0196929 | A1 | 9/2005 | Yuan et al. |
| 2005/0230600 | A1 | 10/2005 | Olson et al. |
| 2007/0228289 | A1 | 10/2007 | Kaszuba et al. |
| 2010/0285240 | A1* | 11/2010 | Rocha-Alvarez ........................... |
| | | | H01L 21/67115 |
| | | | 427/595 |
| 2012/0090691 | A1 | 4/2012 | Baluja et al. |
| 2012/0132618 | A1 | 5/2012 | Baluja et al. |
| 2012/0305946 | A1 | 12/2012 | Kuk et al. |
| 2013/0120737 | A1* | 5/2013 | Pan ........................ G01J 5/08 |
| | | | 356/43 |
| 2014/0116335 | A1 | 5/2014 | Tsuji et al. |

\* cited by examiner

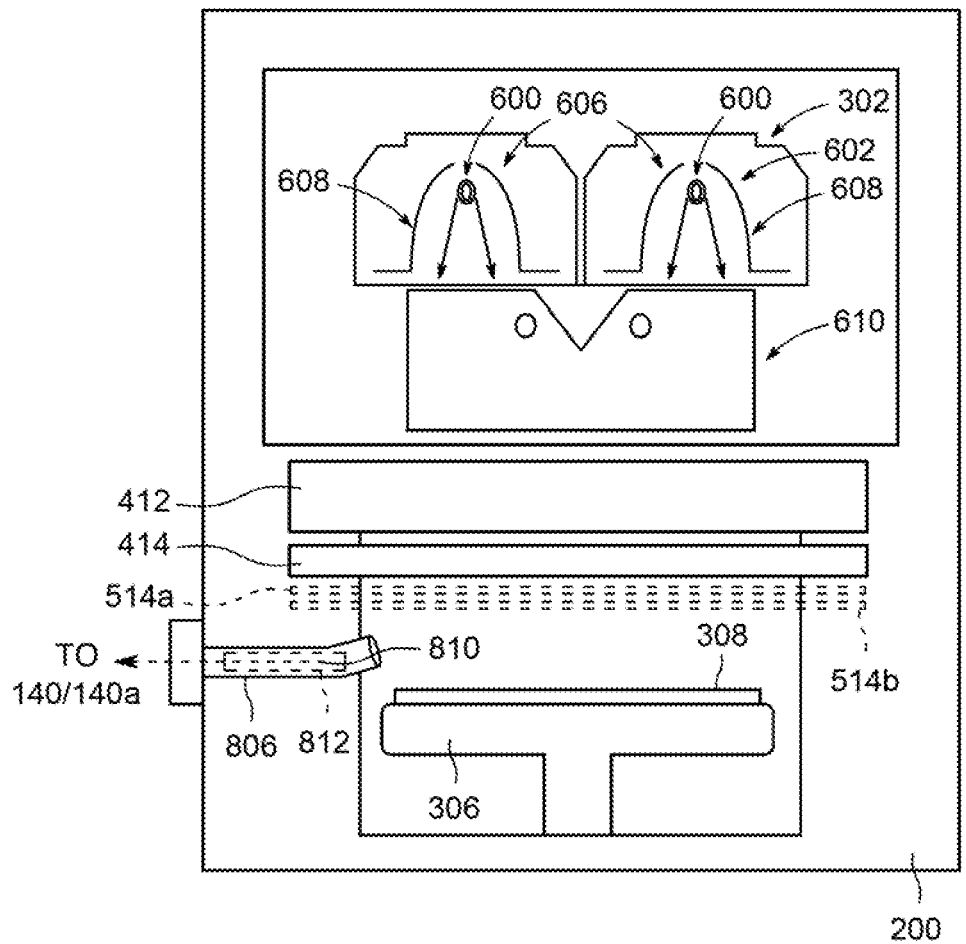

US 11,215,934 B2

IN-SITU LIGHT DETECTION METHODS AND APPARATUS FOR ULTRAVIOLET SEMICONDUCTOR SUBSTRATE PROCESSING

CROSS-REFERENCE TO RELATED APPLICATIONS

This application claims the benefit of and priority to U.S. Provisional Patent Application Ser. No. 62/963,593, which was filed on Jan. 21, 2020, the entire contents of which is incorporated herein by reference.

FIELD

Embodiments of the present disclosure generally relate to a methods and apparatus for processing a substrate, and more particularly, to methods and apparatus for semiconductor substrate processing.

BACKGROUND

Ultraviolet (UV) process chambers configured for curing one or more films on substrates are known. Such process chambers use pulsed UV light from one or more UV lamps including one or more bulbs during a cure process. Various lamp arrays can be used to vary wavelength distribution of incident light, relative motion of a substrate and/or lamp, and real-time modification of lamp reflector shape and/or position. The UV lamps may transmit a broad spectral range of wavelengths of UV radiation (e.g., 100 nm to about 600 nm, including visible light) through one or more transparent showerheads.

Extended use of the UV process chambers can sometimes cause residue to build on the transparent showerheads (e.g., fogging up). The residue on the transparent showerhead can impact UV transmission to the substrate, which, in turn, can degrade curing of a film on the substrate over time.

Therefore, the inventors have provided in-situ light detection methods and apparatus for ultraviolet semiconductor substrate processing.

SUMMARY

Methods and apparatus for in-situ light detection methods and apparatus for ultraviolet semiconductor substrate processing are provided herein. In some embodiments, an apparatus includes an ultraviolet (UV) process chamber, comprising: a vacuum window or a transparent showerhead; a UV light source disposed above one of the vacuum window or the transparent showerhead and configured to generate and transmit UV light into a process volume of the UV process chamber, and a first UV sensor configured to measure at least one of emissivity from the UV light source or irradiance of the UV light transmitted into the process volume and to transmit a signal corresponding to a measured at least one of emissivity from the UV light source or irradiance of the UV light to a controller coupled to the UV process chamber during operation.

In accordance with at least some embodiments of the present disclosure a method of processing a substrate in an ultraviolet (UV) process chamber includes transmitting UV light from a UV light source into a process volume of the UV process chamber; measuring at least one of emissivity from the UV light source or irradiance of the UV light using a first UV sensor; and transmitting a signal corresponding to a measured at least one of emissivity from the UV light source or irradiance of the UV light to a controller coupled to the UV process chamber during operation.

In accordance with at least some embodiments of the present disclosure a non-transitory computer readable storage medium having stored thereon instructions that when executed by a processor perform a method of processing a substrate in an ultraviolet (UV) process chamber comprises transmitting UV light from a UV light source into a process volume of the UV process chamber; measuring at least one of emissivity from the UV light source or irradiance of the UV light using a first UV sensor, and transmitting a signal corresponding to a measured at least one of emissivity from the UV light source or irradiance of the UV light to a controller coupled to the UV process chamber during operation.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 8 is a diagram of V sensor configuration, in accordance with at least some embodiments of the present disclosure.

FIG. 9 is a flowchart of a method for processing a substrate using the apparatus of FIG. 1, in accordance with at least some embodiments of the present disclosure.

Figure 1:
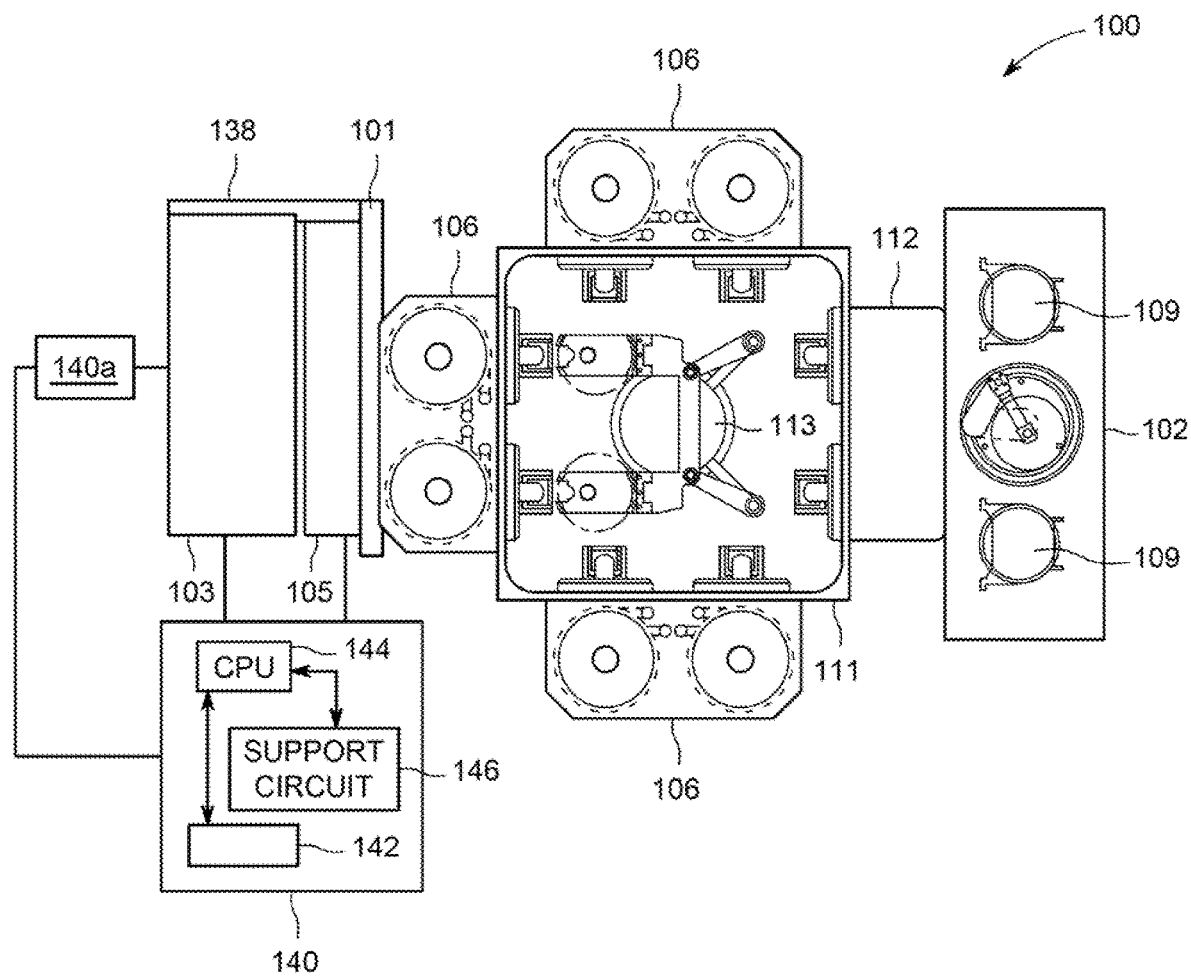
FIG. 1 is a plan view of an apparatus configured for processing a substrate, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of in-situ light detection methods and apparatus for ultraviolet semiconductor substrate processing are provided herein. More particularly, in an example of an application of the present disclosure, an in-situ UV degradation system as described herein is configured to monitor and predict occurrence of refractive index (RI) and/or shrinkage loss in a dielectric film (e.g., using flowable chemical vapor deposition (FCVD) or plasma-enhanced CVD (PECVD)) to form a low density silicon dioxide (e.g., shallow trench isolation (STI), pre-metal dielectric (PMD), black diamond (BD)) or silicon nitride). The UV degradation system is a low cost, high value solution that can enable in-situ monitoring and can predict when a transparent showerhead is degrading due to insufficient transmissivity of UV light onto a substrate (wafer). The UV degradation system improves (e.g., reduces) preventive maintenance (PM) and corrective maintenance (CM) downtime, facilitates troubleshooting, and reduces or eliminates substrate scrap due to RI and film shrinkage drift. The UV degradation system includes one or more suitable UV sensors, such as, for example, a spectral radiometer sensor, configured to measure irradiance including transmissivity, reflectivity, and/or absorption of UV light directed toward a transparent showerhead (e.g., 24×7 in-line transparent showerhead made from quartz, sapphire, and the like) during processing of a substrate (e.g., curing a film on a substrate).

FIG. 1 is a plan view of an apparatus including a UV degradation system configured for processing a substrate, in accordance with at least some embodiments of the present disclosure. The apparatus 100 can be, for example, the PRODUCER® NANOCURE® 3 UV CURE, DSS®, APOLLO®, CORONA® or the PRODUCER® ETERNA® FCVD®, all commercially available from Applied Materials, Inc., of Santa Clara, Calif. Other processing systems can also be modified in accordance with the teachings provided herein.

The apparatus 100 is a self-contained system having the necessary processing utilities supported on a mainframe structure 101. The apparatus 100 generally includes a front end staging area 102 where substrate cassettes 109 are supported and substrates are loaded into and unloaded from a load lock chamber 112, a transfer chamber 111 housing a substrate handler 113 (e.g., robot or other suitable device for handling substrates), a series of tandem processing chambers 106 mounted on the transfer chamber 111 and a back end 138 which houses the support utilities needed for operation of the apparatus 100, such as a gas panel 103, and a power distribution panel 105.

Figure 3:
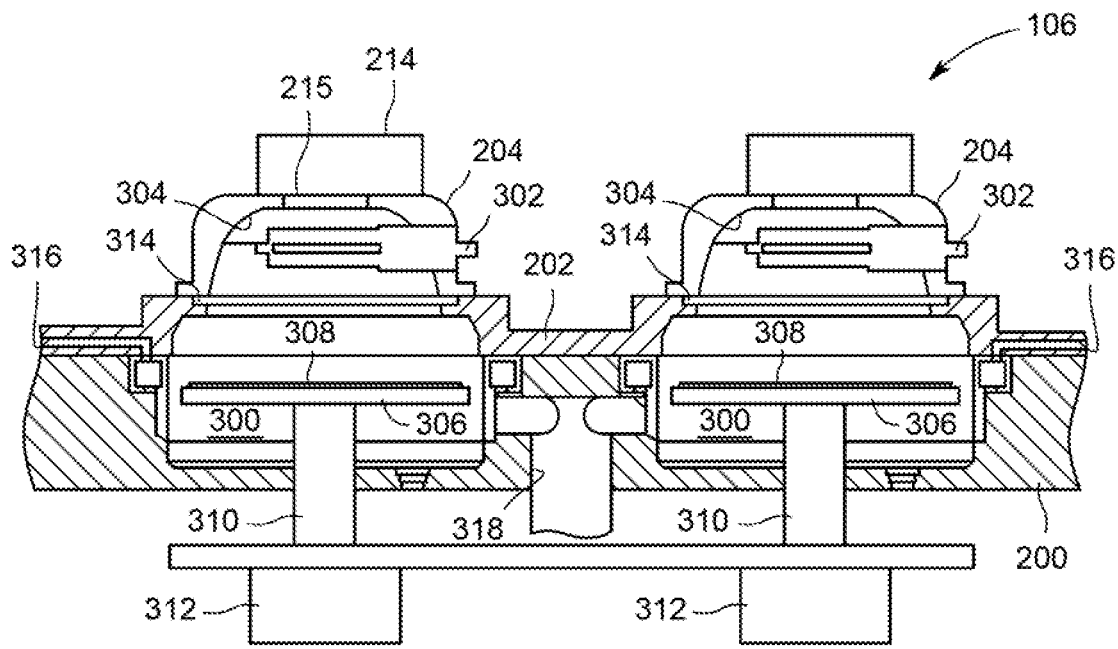
FIG. 3 is a partial, cross-sectional view of the tandem process chamber of FIG. 2, in accordance with at least some embodiments of the present disclosure.

Each of the tandem processing chambers 106 includes two processing regions 300 for processing the substrates (FIG. 3). The two processing regions can share a common supply of gases, common pressure control, and common process gas exhaust/pumping system. The arrangement and combination of chambers may be altered for purposes of performing specific process steps. Any of the tandem processing chambers 106 can include a lid according to aspects of the embodiments described below that includes one or more UV lamps for use in a cure process of a one or more materials, e.g., low k material, on a substrate and/or in a chamber clean process. In at least some embodiments, all three of the tandem processing chambers 106 have UV lamps and are configured as UV curing chambers to run in parallel for maximum throughput.

In alternative embodiments where not all of the tandem processing chambers 106 are configured as UV curing chambers, the apparatus 100 can be adapted with one or more of the tandem processing chambers having supporting chamber hardware known to accommodate various other known processes such as chemical vapor deposition (CVD), FCVD, PECVD, physical vapor deposition (PVD), etch, and the like. For example, the apparatus 100 can be configured with one of the tandem processing chambers 106 as a CVD chamber for depositing materials, such as a low dielectric constant (low k) film, on a substrate. Such a configuration can maximize research and development fabrication utilization and, if desired, eliminate exposure of as-deposited films to atmosphere.

A controller 140, including a central processing unit (CPU) 144, a memory 142, and support circuits 146, is coupled to the various components of the apparatus 100 to facilitate control of the processes described herein. The memory 142 can be any non-transitory computer-readable medium, such as random-access memory (RAM), read only memory (ROM), floppy disk, hard disk, or any other form of digital storage, local or remote to the apparatus 100 or CPU 144. The support circuits 146 are coupled to the CPU 144 for supporting the CPU in a conventional manner. These circuits include cache, power supplies, clock circuits, input/output circuitry and subsystems, and the like. A software routine or a series of program instructions stored in the memory 142, when executed by the CPU 144, causes the tandem processing chambers 106 to perform processes described herein.

Alternatively or additionally, another controller 140a (or server, such as a field service server) can be used in conjunction with or separate from the controller 140. For example, in at least some embodiments, the controller 140 and/or the controller 140a can be coupled to one or more UV sensors disposed in the tandem processing chamber 106 and configured to receive one or more signals indicative of a measured irradiance of and/or emissivity from UV light transmitted from a UV light source, as will be described in greater detail below. As used herein, emissivity (or radiant emittance) from a light source is radiant flux or power emitted from one or more light sources (or any object per unit area), not to be confused with the relative emissivity ratio (radiation factor). Likewise, irradiance is radiant flux received by (or incident upon) a surface per unit area.

Figure 2:
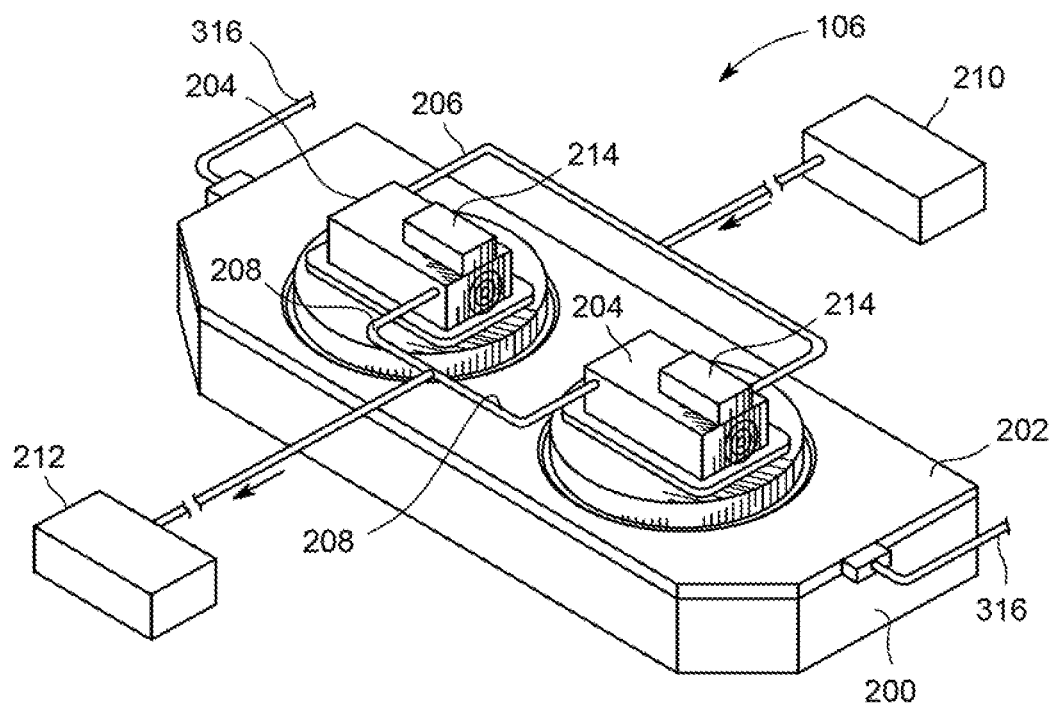
FIG. 2 is a perspective view of tandem process chamber of the apparatus of FIG. 1, in accordance with at least some embodiments of the present disclosure.

FIG. 2 illustrates one of the tandem processing chambers 106, which are configured for UV curing, of the apparatus 100. The tandem processing chamber 106 includes a body 200 (e.g., defined by a chamber wall) and a lid 202 that can be hinged to the body 200. The body 200 may be made from aluminum. Coupled to the lid 202 are two housings 204 that are each coupled to inlets 206 along with outlets 208 for passing cooling air through an interior of the housings 204. A central pressurized air source 210 provides a sufficient flow rate of air to the inlets 206 to ensure proper operation of any UV lamp and/or power sources 214 for the bulbs associated with the tandem processing chamber 106. The outlets 208 receive exhaust air from the housings 204, which is collected by a common exhaust system 212.

FIG. 3 shows a partial cross-sectional view of the tandem processing chamber 106 with the lid 202, the housings 204 and the power sources 214. Each of the housings 204 cover a respective one of two UV light sources, such as UV lamps 302, disposed respectively above two processing regions 300 defined within the body 200. Each of the processing regions 300 includes a heating substrate support, such as substrate support 306, for supporting a substrate 308 within the processing regions 300. The substrate supports 306 can be made from ceramic or metal such as aluminum. The substrate supports 306 couple to stems 310 that extend through a bottom of the body 200 and are operated by drive systems 312 to move the substrate supports 306 in the processing regions 300 toward and away from the UV lamps 302.

In general, any UV light source such as one of mercury microwave arc lamps, pulsed xenon flash lamps or high-efficiency UV light emitting diode arrays may be used. The UV lamps 302 include one or more sealed plasma bulbs filled with one or more gases such as xenon or mercury for excitation by the power sources 214. The power sources 214 can be microwave generators that can include one or more magnetrons (not shown) and one or more transformers (not shown) to energize filaments of the magnetrons. In one embodiment having kilowatt microwave (MW) power sources, each of the housings 204 includes an aperture 215 adjacent the power sources 214 to receive up to about 6000 W of microwave power from the power sources 214 to subsequently generate up to about 100 W of UV light from each of the bulbs of the UV lamps 302.

The power sources 214 can include radio frequency (RF) energy sources that are capable of excitation of the gases within the bulbs of the UV lamps 302. The configuration of the RF excitation in the bulb can be capacitive or inductive. For example, an inductively coupled plasma (ICP) bulb can be used to efficiently increase bulb brilliancy by generation of denser plasma than with the capacitively coupled discharge.

The UV lamps 302 emit light across a broad band of wavelengths from 170 nm to 600 nm. In one embodiment, the UV lamps 302 emit light at wavelengths from 185 nm to 300 nm. The gases selected for use within the bulbs of the UV lamps 302 can determine the wavelengths emitted. UV light emitted from the UV lamps 302 enters the processing regions 300 by passing through windows 314 disposed in apertures in the lid 202. The windows 314 can be made of quartz glass and have sufficient thickness to maintain vacuum without cracking. Further, the windows 314 can be at least one of fused silica, quartz, sapphire, or metal fluorides, e.g., aluminum fluoride ($AlF_3$), calcium fluoride ($CaF_2$), lanthanum trifluorde ($LaF_3$), magnesium fluoride ($MgF_2$), yttrium fluoride ($YF_3$), that transmits UV light down to approximately 150 nm. Since the lid 202 seals to the body 200 and the windows 314 are sealed to the lid 202, the processing regions 300 provide volumes capable of maintaining pressures from approximately 1 Torr to approximately 650 Torr, e.g., processing of about 10 Torr to about 100 Torr and cleaning of about 1 Torr to about 5 Torr. Processing or cleaning gases enter the processing regions 300 via a respective one of two inlet passages 316. The processing or cleaning gases then exit the processing regions 300 via a common outlet port 318. Additionally, the cooling air supplied to the interior of the housings 204 circulates past the UV lamps 302 but is isolated from the processing regions 300 by the windows 314.

The housings 204 may include an interior parabolic surface (inner primary reflector) defined by a cast quartz lining 304 coated with a dichroic film. The cast quartz linings 304 reflect UV light emitted from the UV lamps 302 and are shaped to suit the cure processes as well as the chamber clean processes based on the pattern of UV light directed by the cast quartz linings 304 into the processing regions 300. The cast quartz linings 304 may adjust to better suit each process or task by moving and changing the shape of the interior parabolic surface. Additionally, the cast quartz linings 304 may transmit infrared light and reflect ultraviolet light emitted by the bulbs of the UV lamps 302 due to the dichroic film. The dichroic film usually constitutes a periodic multilayer film composed of diverse dielectric materials having alternating high and low refractive index. Since the coating is non-metallic, microwave radiation from the power sources 214 that is downwardly incident on the backside of the cast quartz linings 304 does not significantly interact with, or get absorbed by, the modulated layers and is readily transmitted for ionizing the gas in the bulbs of the UV lamps 302.

Substrates are brought into the processing region 300 to perform a post-treatment cure of dielectric films deposited on the substrate 308. The films may be low k dielectric films having porogen including, for example, a silicon backbone structure and carbon within the film. The silicon backbone structure and carbon within the film is sometimes referred to as porogen. After UV exposure, the carbon bonds break and the carbon outgases from the film, leaving a silicon backbone, and increasing porosity which decreases the k value and reduces the current carrying capacity of the film.

Figure 4:
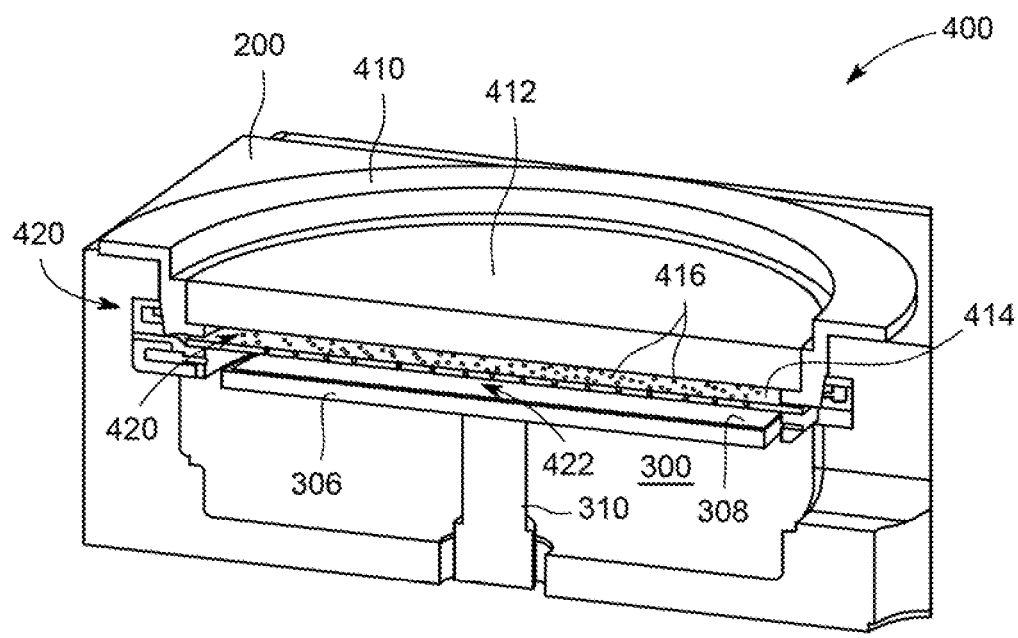
FIG. 4 is a partial, cut-away view of a process chamber of the tandem process chamber of FIG. 2, in accordance with at least some embodiments of the present disclosure.

FIG. 4 is a partial, cut-away view of a process chamber of the tandem process chamber, in accordance with at least some embodiments of the present disclosure. A window assembly is positioned within the processing chamber 400 to hold a UV vacuum window 412. The window assembly includes a vacuum window clamp 410 that rests on a portion of the body 200 and supports the UV vacuum window 412 through which UV light may pass from the UV lamps 302, which is part of the lid assembly above the body 200. The UV vacuum window 412 is positioned between the UV radiation source, such as UV lamps 302, and the substrate support 306. The UV lamps 302 are spaced apart from the substrate support 306 and configured to generate and transmit ultraviolet radiation to a substrate 308 positioned on the substrate support 306.

One or more transparent showerheads 414 can be positioned within the processing region 300 and between the UV vacuum window 412 and the substrate support, such as the substrate support 306. For example, in FIG. 4, a transparent showerhead 414, e.g., a single transparent showerhead, is shown positioned within the processing region 300 and between the UV vacuum window 412 and the substrate support, such as the substrate support 306.

Figure 5:
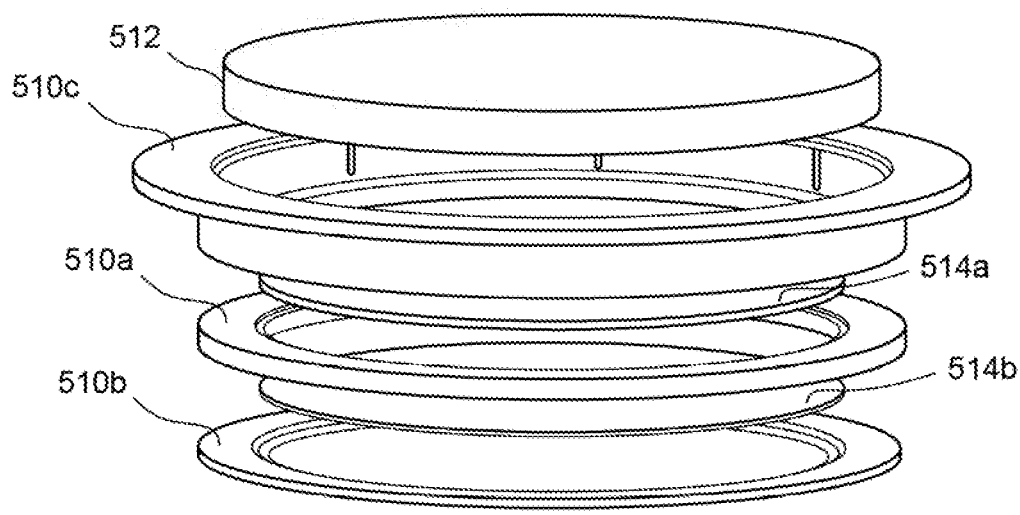
FIG. 5 is an exploded view of a transparent vacuum window and transparent showerheads, in accordance with at least some embodiments of the present disclosure.

Alternatively, in at least some embodiments, the transparent showerhead 414 can be replaced with a pair of transparent showerheads 514a, 514b that can be positioned within the processing region 300 and between the UV vacuum window 412 and the substrate support, such as the substrate support 306 (see FIGS. 5 and 8, for example). In such embodiments, the pair of transparent showerheads 514a, 514b can be respectively supported by an upper showerhead clamp 510a and a lower showerhead clamp 510b. The transparent showerheads 514a, 514b can be spaced-apart from each other by a distance of about 10 mil to about 500 mil. Moreover, a distance or spacing between the transparent showerhead 514b (e.g., a lower showerhead) and the substrate 308 and/or the substrate support 306 can be about 100 mil to about 2000 mil. For example, in at least some embodiments, the distance can be about 500 mil to about 1000 mil. Additionally, a vacuum window 512, which can be similar to the UV vacuum window 412, can be supported by a vacuum window clamp 510c. The upper showerhead clamp 510a, lower showerhead clamp 510b, and the vacuum window clamp 510c can rest on a portion of the body 200, as described above with respect to the vacuum window clamp 410.

Continuing with reference to FIG. 4, the transparent showerhead 414 defines an upper process region 420 between the UV vacuum window 412 and transparent showerhead 414 and further defines a lower process region 422 between the transparent showerhead 414 and the substrate support, such as substrate support 306. The transparent showerhead 414 also has one or more passages 416 between the upper process region 420 and lower process region 422.

The passages 416 may have a roughened surface, sometimes referred to as "frosted", so that the passages 416 are not perfectly transparent, which otherwise could potentially cause shadows on the substrate 308 and impair proper curing of the film. The passages 416, which may be frosted, diffuse the UV light so there is no light pattern on the substrate 308 during processing.

The transparent showerhead 414 forms a second window through which UV light may pass to reach the substrate 308. As a second window, the transparent showerhead 414 needs to be transparent to the wavelengths of light desired for curing the film on the substrate 308. Accordingly, the transparent showerhead 414 may be formed of various transparent materials such as at least one of quartz or sapphire. For example, in at least some embodiments, the transparent showerhead 414 can be formed from quartz. The passages 416 may be formed by drilling holes through a quartz piece to form and shape the transparent showerhead 414 to fit within the processing region 300. The surface of the quartz piece may be flame polished whereas the drilled holes may be etched to form the roughened surface 418. The size and density of the passages 416 may be uniform or non-uniform to effectuate the desired flow characteristics across the substrate surface.

The transparent showerhead 414 and UV vacuum window 412 may be coated to have a band pass filter and to improve transmission of the desired wavelengths. For example, an anti-reflective coating (ARC) may be deposited on the transparent showerhead 414 and UV vacuum window 412 to improve the transmission efficiency of desired wavelengths. A reflective coating to reflect IR and allow UV to pass or a dichroic coating to reflect UV and allow IR to pass may also be applied to the transparent showerhead 414 and UV vacuum window 412 surfaces. The coatings may be formed by PVD, CVD, or other suitable deposition techniques. The coatings may comprise an inorganic film layer having a desired film transmittance and refractive index and resistance to corrosive environments (e.g., fluorine environments) that can assist in the transmission of light through the transparent showerhead 414 and UV vacuum window 412 to the substrate 308. In one embodiment, the coatings may contain a, aluminum oxide ($Al_2O_3$), hafnium dioxide ($HfO_2$), silicon oxide ($SiO_2$), zirconium dioxide ($ZrO_2$), fluorides, such as $AlF_3$, $CaF_2$, $LF_3$, $MgF_2$, or $YF_3$, or combinations thereof, which are formed on the surfaces of the UV vacuum window 412 and transparent showerhead 414.

In another embodiment, the ARC coating may be a composite layer having one or more layers formed on the surfaces of the UV vacuum window 412 and transparent showerhead 414. In one embodiment, the ARC coating may be a film stack including a first layer formed on a second layer, which is formed on the surfaces of the of the UV vacuum window 412 and transparent showerhead 414. In one embodiment, the first layer may be one of $Al_2O_3$, $HfO_2$, $SiO_2$, $ZrO_2$, fluorides, such as $AlF_3$, $CaF_2$, $LaF_3$, $MgF_2$, $YF_3$, or combinations.

In embodiments where the pair of transparent showerheads 514a, 514b are used, the transparent showerheads 514a, 514b can be configured similarly to the transparent showerhead 414, e.g., with one or more passages 416, having a roughened surface, made of quartz or sapphire with a flame polish, and may be coated to have a band pass filter to improve transmission of the desired wavelengths, etc.

Figure 6:
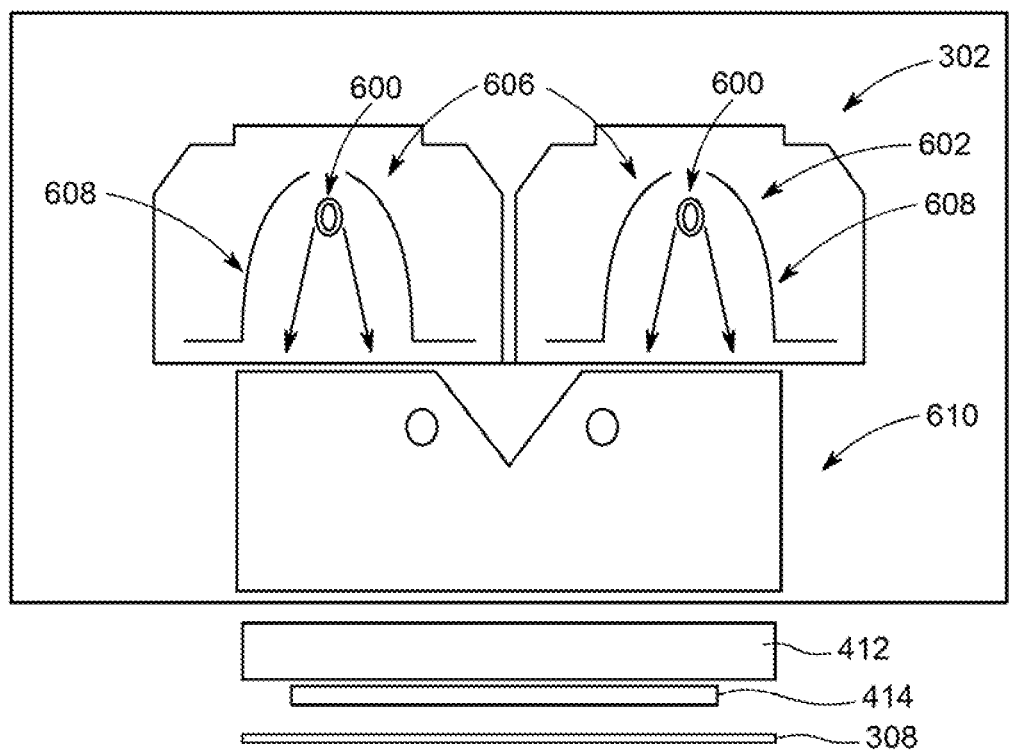
FIG. 6 is a diagram of an inner primary reflector, an outer primary reflector, and a secondary reflector, in accordance with at least some embodiments of the present disclosure.

FIG. 6 is a diagram of an inner primary reflector, an outer primary reflector, and a secondary reflector, in accordance with at least some embodiments of the present disclosure.

For example, the UV lamp 302 includes a pair of inner primary reflectors 606 and a pair of outer primary reflectors 608 that are disposed in a resonant cavity 602 defined within the UV lamp 302 and are configured to reflect the UV light generated by one or more bulbs 600 toward the substrate 308. In at least some embodiments, the UV lamp 302 includes two bulbs 600, such as the bulbs described above, that are disposed in the resonant cavity 602. A secondary reflector 610 is disposed beneath the inner primary reflectors 606 and the pair of outer primary reflectors 608 and is configured to facilitate reflecting the UV light generated by the bulbs 600 (and/or reflected by the inner primary reflectors 606) and directing the UV light through the UV vacuum window 412 and the transparent showerhead 414 (and/or the pair of transparent showerheads 512a, 512b) toward a process volume, e.g., process region 422, in which a substrate, e.g., the substrate 308, is disposed. In at least some embodiments, the secondary reflector 610 can be movable from a first position for detecting the emissivity from a UV light source, e.g., the UV lamps 302, to a second position for detecting irradiance including transmissivity, reflection, and/or absorption of UV light.

Figure 7:
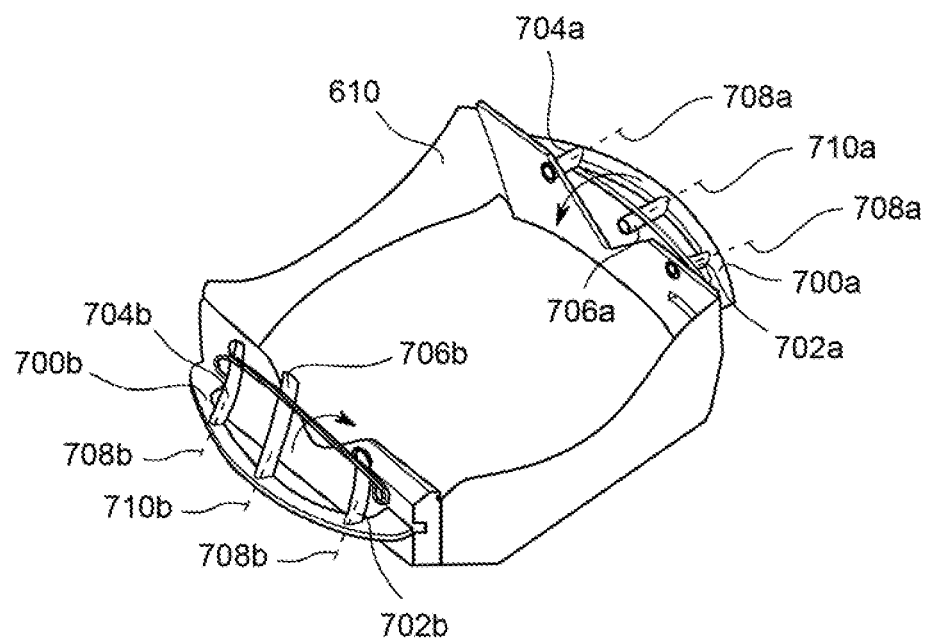
FIG. 7 is a perspective view of a secondary reflector including one or more manifolds coupled thereto, in accordance with at least some embodiments of the present disclosure.

FIG. 7 is a perspective view of the secondary reflector 610 including one or more manifolds coupled thereto, in accordance with at least some embodiments of the present disclosure. For example, in at least some embodiments, the secondary reflector 610 has coupled thereto a manifold 700a and a manifold 700b. Alternatively, one of the manifolds 700a, 700b can be coupled to the secondary reflector 610. The manifolds 700a, 700b can be made from one more suitable materials, including plastic, metal, ceramic, etc.

Each of the manifolds 700a, 700b includes primary inner pipes 702a, 702b (or tubes) and primary outer pipes 704a, 704b (or tubes), respectively. Each of the primary inner pipes 702a, 702b and the primary outer pipes 704a, 704b are configured for light collection and/or to support or house a UV sensor 708a, 708b (e.g., one or more second UV sensors), respectively. Disposed between each of the primary inner pipes 702a, 702b and the primary outer pipes 704a, 704b are middle pipes 706a, 706b, respectively. The middle pipes 706a, 706b are configured for light collection and/or to support or house one or more UV sensors 710a, 710b (e.g., a first UV sensor). The UV sensors 708a, 708b, 710a, 710b hereinafter collectively referred as UV sensors.

The UV sensors can be any suitable sensor that is capable of measuring and/or detecting emissivity and/or irradiance (including transmissivity, reflection, and/or absorption) produced by the UV lamps 302, the inner primary reflectors 606, the outer primary reflectors 608, and/or the bulbs 600. Likewise, the UV sensors can be any suitable sensor that is capable of measuring emissivity and/or irradiance (including transmissivity reflectivity, or absorption) of the UV light transmitted into the process volume, e.g., the process region 422. For example, in at least some embodiments, the UV sensors 708a, 708b can be fiber optic UV sensors capable of emissivity (or radiant emittance) measurements for determining radiant power from one or more light sources (e.g., UV lamps 302), such as the Sekidenko OR4000T UV sensor. Similarly, the UV sensors 710a, 710b can be a fiber optic UV sensors capable of emissivity and/or irradiance measurements, such as a spectral radiometer or irradiance sensor. In such embodiments, the UV sensors 710a, 710b can provide additional emittance measurements during operation, which can increase an overall accuracy of the emittance measurements. In at least some embodiments, the UV sensors 708a, 7086b can be a spectral radiometer or irradiance sensor configured for emissivity and/or irradiance measurements. In such embodiments, the UV sensors 708a, 708b can provide additional irradiance measurements during operation, which can increase an overall accuracy of the irradiance measurements. In at least some embodiments, one or more additional components can be used in conjunction with the UV sensors to facilitate measuring emissivity and/or irradiance during operation. For example, in at least some embodiments one or more diffusers and/or adapters, such as a cosine correcting diffuser and right-angle cosine adapter, can be coupled to the UV sensors and configured to improve measuring/detecting emissivity and/or irradiance during operation. The UV sensors are in operable communication with the controller 140 and/or the controller 140a.

In at least some embodiments, each of the manifolds 700a, 700b can be movable from a first position for detecting the emissivity of a UV light source, e.g., the UV lamps 302, to a second position for detecting irradiance (e.g., transmissivity, reflectivity, and/or absorption) of UV light, as will be described in greater detail below. For example, in at least some embodiments, with the manifolds 700a, 700b in the first position, the UV sensors will be oriented in a generally upward direction (e.g., toward the bulbs 600). Conversely, with the manifolds 700a, 700b in the second position, the UV sensors will be oriented in a generally downward direction (e.g., toward the UV vacuum window 412 or vacuum window 512 and/or the transparent showerhead 414 or the pair of transparent showerheads 514a, 514b).

One or more of servos, motors, and the like (not shown), under control of the controller 140 or the controller 140a, can be configured to move each of the manifolds 700a, 700b. For example, in at least some embodiments, during operation, the manifolds 700a, 700b can be independently controlled with respect to one another, so that the manifold 700a is in the first position and the manifold 700b is in the second position, or vice versa. Alternatively, during operation, the manifolds 700, 700b can be configured so that manifolds 700a, 700b are in the first position and/or the second position at the same time as each other.

Alternatively or additionally, the primary inner pipes 702a, 702b, the primary outer pipes 704a, 704b, the middle pipes 706a, and 706b can be coupled to the manifolds 700a, 700b, respectively, so that the primary inner pipes 702a, 702b and the primary outer pipes 704a, 704b are fixed in the a first position for detecting the emissivity of a UV light source, e.g., the UV lamps 302, and the middle pipes 706a, 706b are fixed in the second position for detecting irradiance (e.g., transmissivity, reflectivity, and/or absorption) of UV light.

FIG. 8 is a diagram of UV sensor configuration, in accordance with at least some embodiments of the present disclosure. Unlike supporting or housing a UV sensor, e.g., UV sensors 710a, 710b, on a middle pipe coupled to a secondary reflector as described above with respect to FIG. 7, a UV sensor 810 (e.g., a first UV sensor) can be provided in or on one or more other areas of the apparatus 100. For example, in at least some embodiments, one or more pipes 806 (or tubes) can be coupled to the body 200 of the apparatus 100. In the embodiment illustrated in FIG. 8, for example, a pipe 806 (one pipe 806 illustrated in FIG. 8) can be coupled to the body 200 (e.g., chamber wall) and can lead to the lower process region 422 (e.g., below a transparent showerhead), so that the UV sensor 810 can measure/detect emissivity or irradiance including transmissivity, reflectivity, and/or absorption of UV light transmitted through the transparent showerhead. For illustrated purposes, the UV sensor 810 is shown disposed below the transparent showerhead 414, but the UV sensor 810 can also be disposed below the pair of transparent showerheads 514a, 514b, shown in phantom in FIG. 8. A sleeve 812 can be provided inside the pipe 806 and configured to encase or surround the UV sensor 810. Encasing or surrounding the UV sensor 810 with the sleeve 812 protects the UV sensor 810 from the caustic environment present within the lower process region 422. The sleeve 812 can be made from one or more materials suitable for protecting the UV sensor 810 from the caustic environment present within the lower process region 422. Suitable material can be quartz, sapphire, ceramic, or the like. For example, in at least some embodiments, the sleeve 812 can be made from quartz. Additionally, the sleeve 812 can be coated with one or more materials to protect the UV sensor 810 from the caustic environment in tandem processing chambers 106. For example, in at least some embodiments, the sleeve 812 can be coated with $AlF_3$, $CaF_2$, $LF_3$, $MgF_2$, or $YF_3$ or other suitable material(s) capable of providing protection for the sleeve 812.

FIG. 9 is a flowchart of a method 900 for processing a substrate using the apparatus 100 of FIG. 1, e.g., a UV process chamber as described above, in accordance with at least some embodiments of the present disclosure.

Initially, a substrate, e.g., the substrate 308, can be positioned on the substrate support 306 disposed within a process volume, e.g., the lower process region 422, of the apparatus 100 for performing a UV cure process, as described above. Next, at 902, UV light from a UV light source, e.g., the UV lamps 302, is transmitted toward the substrate in the process volume. During curing of the substrate, one or more parameters may be measured/monitored/detected. More particularly, at 904, while the substrate is being cured, emissivity and/or irradiance of the UV lamp 302 can be measured using, for example, one or more UV sensors, e.g., the UV sensors 708a, 708b and/or the UV sensors 710a, 710b, and/or 810.

For example, to measure emissivity and/or irradiance (e.g., to determine a radiant power) of the UV lamps 302, with the manifolds 700a, 700b (and/or the secondary reflector 610) in the first position (e.g., a generally upward direction), the UV sensors 708a, 708b are oriented in a direction toward the UV lamps 302 and configured to measure a emissivity of the UV lamps 302. The measured emissivity (or in some embodiments a measured irradiance) can be transmitted to a controller, e.g., the controller 140 and/or the controller 140a.

Similarly, in embodiments when the UV sensors 710a, 710b are used, after (or while) the emissivity (and/or irradiance) is measured, the manifolds 700a, 700b (and/or the secondary reflector 610) can be rotated from the first position to a second position. In the second position the UV sensors 710a, 710b can be oriented in a direction toward (e.g., from above) a vacuum window (e.g., the UV vacuum window 412 or vacuum window 512) and/or a transparent showerhead(s) (e.g., the transparent showerhead 414 or the pair of transparent showerheads 514a, 514b) and are configured to measure irradiance including transmissivity, reflectivity, and/or absorption of the UV light reflected from the vacuum window and/or the transparent showerhead(s). The measured irradiance can be transmitted from the UV sensors 710a, 710b to a controller, e.g., the controller 140 and/or the controller 140a.

In at least some embodiments, as noted above, the manifolds 700a, 700b can be independently controlled using the controller 140 and/or the controller 140a. For example, in at least some embodiments, the manifold 700a can be oriented in the first position while the manifold 700b can be oriented in the second position or vice versa. In such embodiments the UV sensors 708a, 710a on the manifold 700a can be configured to measure emissivity (e.g., for determining radiant power of the bulbs 600) while the UV sensors 708b, 710b can be configured to measure irradiance (e.g., transmissivity, reflectivity, and/or absorption) of the UV light reflected from the vacuum window and/or the transparent showerhead(s).

Alternatively or additionally, the UV sensor 810 can be used to measure irradiance (e.g., after or while the emissivity is measured). For example, the UV sensor 810, which is oriented in a direction toward (e.g., from below) the UV vacuum window 412 (or vacuum window 512) and/or the transparent showerhead 414 (or the pair of transparent showerheads 514a, 514b) can measure irradiance including transmissivity, reflectivity, and/or absorption of the UV light transmitted through the UV vacuum window 412 and/or the transparent showerhead 414. The measured irradiance can be transmitted to a controller, e.g., controller 140 and/or the controller 140a.

Next, at 906, a signal corresponding to a measured emissivity from the UV light source or irradiance of the UV light is transmitted to the controller. For example, the controller receives the measured emissivity and/or irradiance and compares the measured irradiance with a threshold. When the measured emissivity and/or irradiance is one of less than, greater than, or equal to the threshold, the controller is further configured to stop processing of the substrate, alert a user, and/or initiate cleaning of the transparent showerhead. For example, in at least some embodiments, when the measured emissivity and/or irradiance is greater than the threshold, the controller is configured to stop processing of the substrate.

While the foregoing is directed to embodiments of the present disclosure, other and further embodiments of the disclosure may be devised without departing from the basic scope thereof.

The invention claimed is:

1. An ultraviolet (UV) process chamber, comprising:
a vacuum window or a transparent showerhead;
a UV light source disposed above one of the vacuum window or the transparent showerhead and configured to generate and transmit UV light into a process volume of the UV process chamber; and
a first UV sensor movable during operation and configured to measure at least one of emissivity from the UV light source or irradiance of the UV light transmitted into the process volume and to transmit a signal corresponding to a measured at least one of emissivity from the UV light source or irradiance of the UV light to a controller coupled to the UV process chamber during operation.

2. The UV process chamber of claim 1, wherein the first UV sensor is coupled to a chamber wall of the UV process chamber and is orientated in a direction toward the transparent showerhead.

3. The UV process chamber of claim 2, wherein the first UV sensor is housed in a sleeve that is coupled to the chamber wall.

4. The UV process chamber of claim 3, wherein the sleeve is coated with at least one of aluminum fluoride ($AlF_3$), calcium fluoride ($CaF_2$), lanthanum trifluoride ($LaF_3$), magnesium fluoride ($MgF_2$), yttrium fluoride ($YF_3$).

5. The UV process chamber of claim 1, wherein the first UV sensor is coupled to a secondary reflector of the UV process chamber and is orientated in a direction toward the transparent showerhead.

6. The UV process chamber of claim 5, further comprising at least one second UV sensor configured to measure emissivity from the UV light source.

7. The UV process chamber of claim 6, wherein the secondary reflector is movable from a first position for detecting the at least one of emissivity from the UV light source or irradiance of the UV light using at least one of the first UV sensor and the at least one second UV sensor to a second position for detecting the irradiance of the UV light using the first UV sensor.

8. The UV process chamber of claim 1, wherein the first UV sensor comprises two first UV sensors each coupled to corresponding secondary reflectors of the UV process chamber and orientated in a direction toward the transparent showerhead.

9. The UV process chamber of claim 8, further comprising at least two second UV sensors each coupled to the corresponding secondary reflectors and the controller and configured to detect emissivity from the UV light source.

10. The UV process chamber of claim 9, wherein each of the corresponding secondary reflectors is movable from a first position for detecting the at least one of emissivity or irradiance of the UV light using the at least two second UV sensors and the two first UV sensors to a second position for detecting the irradiance of the UV light using the two first UV sensors.

11. The UV process chamber of claim 1, wherein the controller is configured to compare the measured at least one of emissivity or irradiance with a threshold and when the measured at least one of emissivity or irradiance is one of less than, greater than, or equal to the threshold, the controller is further configured to at least one of stop processing of a substrate, alert a user, or initiate cleaning of the transparent showerhead.

12. The UV process chamber of claim 1, wherein the UV light source is one of mercury microwave arc lamps, pulsed xenon flash lamps, or high-efficiency UV light emitting diode arrays.

13. The UV process chamber of claim 1, wherein the vacuum window or transparent showerhead is made from at least one of sapphire or quartz.

14. A method of processing a substrate in an ultraviolet (UV) process chamber, comprising:
transmitting UV light from a UV light source into a process volume of the UV process chamber;
measuring at least one of emissivity from the UV light source or irradiance of the UV light using a first UV sensor that is movable during operation; and
transmitting a signal corresponding to a measured at least one of emissivity from the UV light source or irradiance of the UV light to a controller coupled to the UV process chamber during operation.

15. The method of claim 14, further comprising measuring the emissivity from the UV light source and transmitting a signal corresponding to a measured emissivity from the UV light source with at least one second UV sensor coupled to a secondary reflector and the controller.

16. The method of claim 15, further comprising moving the secondary reflector from a first position for detecting the at least one of emissivity from the UV light source or irradiance of the UV light using at least one of the first UV sensor and the at least one second UV sensor and to a second position for detecting the irradiance of the UV light using the first UV sensor.

17. The method of claim 14, further comprising comparing the measured at least one of emissivity or irradiance with a threshold and when the measured at least one of emissivity or irradiance is less than, greater than, or equal to the threshold, at least one of stopping processing of the substrate, alerting a user, or initiating cleaning of a transparent showerhead.

18. A non-transitory computer readable storage medium having stored thereon instructions that when executed by a processor perform a method of processing a substrate in an ultraviolet (UV) process chamber, comprising:
 transmitting UV light from a UV light source into a process volume of the UV process chamber;
 measuring at least one of emissivity from the UV light source or irradiance of the UV light using a first UV sensor that is movable during operation; and
 transmitting a signal corresponding to a measured at least one of emissivity or irradiance of the UV light to a controller coupled to the UV process chamber during operation.

19. The non-transitory computer readable storage medium of claim 18, wherein the method further comprises measuring the emissivity from the UV light source and transmitting a signal corresponding to a measured emissivity from the UV light source with at least one second UV sensor coupled to a secondary reflector and the controller.

20. The non-transitory computer readable storage medium of claim 19, wherein the method further comprises moving the secondary reflector from a first position for detecting the at least one of emissivity from the UV light source or irradiance of the UV light using at least one of the first UV sensor and the at least one second UV sensor and to a second position for detecting the irradiance of the UV light using the first UV sensor.

* * * * *